United States Patent
Tawara

(10) Patent No.: US 10,573,716 B2
(45) Date of Patent: Feb. 25, 2020

(54) METHOD OF MANUFACTURING A SILICON CARBIDE SEMICONDUCTOR DEVICE INCLUDING DEPOSITING A SECOND SILICON CARBIDE SEMICONDUCTOR ON AN ETCHED SILICON CARBIDE BASE REGION

(71) Applicant: FUJI ELECTRIC CO., LTD., Kawasaki-shi, Kanagawa (JP)

(72) Inventor: Takeshi Tawara, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/420,181

(22) Filed: Jan. 31, 2017

(65) Prior Publication Data
US 2017/0271455 A1 Sep. 21, 2017

(30) Foreign Application Priority Data

Mar. 16, 2016 (JP) .................... 2016-053121

(51) Int. Cl.
*H01L 21/02* (2006.01)
*H01L 21/324* (2006.01)
(Continued)

(52) U.S. Cl.
CPC .... *H01L 29/1608* (2013.01); *H01L 21/30604* (2013.01); *H01L 21/324* (2013.01);
(Continued)

(58) Field of Classification Search
None
See application file for complete search history.

(56) References Cited

U.S. PATENT DOCUMENTS 3,382,113 A * 5/1968 Ekkehard ................ H01L 21/00
117/88
3,520,740 A * 7/1970 Addamiano ........ H01L 29/1608
117/951

(Continued)

FOREIGN PATENT DOCUMENTS

JP 2003234301 A 8/2003
JP WO 2013175840 A1 * 11/2013 ........... H01L 21/046
(Continued)

OTHER PUBLICATIONS

Machine translation of WO2013175840A1, from Google Patents on Sep. 12, 2017.*

(Continued)

*Primary Examiner* — Anh D Mai
(74) *Attorney, Agent, or Firm* — Rabin & Berdo, P.C.

(57) ABSTRACT

A silicon carbide semiconductor device, including a silicon carbide semiconductor substrate of a first conductivity type, a first silicon carbide semiconductor deposition layer of the first conductivity type, deposited on a front surface of the silicon carbide semiconductor substrate and having an impurity concentration that is lower than that of the silicon carbide semiconductor substrate, a base region of a second conductivity type, selectively provided in the first silicon carbide semiconductor deposition layer at a front surface thereof, and a second silicon carbide semiconductor deposition layer of the second conductivity type, deposited on the front surface of the first silicon carbide semiconductor deposition layer. The base region has an impurity concentration of $1 \times 10^{18}$ to $1 \times 10^{20}/cm^3$ and a thickness of 0.3 to 1.0 μm. The second silicon carbide semiconductor deposition layer has a surface defect density of 3 defects/$cm^2$.

2 Claims, 6 Drawing Sheets

(51) Int. Cl.
  *H01L 29/16* (2006.01)
  *H01L 29/66* (2006.01)
  *H01L 21/306* (2006.01)
  *H01L 29/10* (2006.01)
  *H01L 29/36* (2006.01)

(52) U.S. Cl.
  CPC .......... *H01L 29/1004* (2013.01); *H01L 29/36* (2013.01); *H01L 29/66068* (2013.01); *H01L 21/0262* (2013.01); *H01L 21/02378* (2013.01); *H01L 21/02447* (2013.01); *H01L 21/02529* (2013.01); *H01L 21/02579* (2013.01)

(56) References Cited

U.S. PATENT DOCUMENTS

| | | | |
|---|---|---|---|
| 6,306,211 B1* | 10/2001 | Takahashi et al. | C30B 25/02 117/86 |
| 2003/0080384 A1* | 5/2003 | Takahashi | C30B 25/02 257/347 |
| 2005/0001217 A1* | 1/2005 | Kusumoto | H01L 21/046 257/77 |
| 2006/0057796 A1 | 3/2006 | Harada et al. | |
| 2007/0108450 A1* | 5/2007 | O'Loughlin | C30B 25/02 257/77 |
| 2008/0318359 A1* | 12/2008 | Yonezawa | C30B 23/02 438/105 |
| 2009/0134402 A1* | 5/2009 | Yatsuo | H01L 21/0465 257/77 |
| 2009/0173949 A1* | 7/2009 | Yatsuo | H01L 21/8213 257/77 |
| 2009/0230404 A1* | 9/2009 | Masuda | C23C 16/325 257/77 |
| 2010/0012951 A1* | 1/2010 | Yatsuo | H01L 29/086 257/77 |
| 2015/0076521 A1* | 3/2015 | Tanaka | H01L 29/1608 257/77 |
| 2015/0102363 A1* | 4/2015 | Tanaka | H01L 21/046 257/77 |
| 2016/0315186 A1 | 10/2016 | Kinoshita et al. | |
| 2017/0098694 A1 | 4/2017 | Tamura | |

FOREIGN PATENT DOCUMENTS

| | | |
|---|---|---|
| JP | 2015230998 A | 12/2015 |
| WO | WO-2004/036655 A1 | 4/2004 |
| WO | 2016013471 A1 | 1/2016 |

OTHER PUBLICATIONS

Ikeda et al. High power AlGaN/GaN HFET with a high breakdown voltage of over 1.8 kV on 4 inch Si substrates and the suppression of current collapse, Proceedings of the 20th International Symposium on Power Semiconductor Devices & IC's May 18-22, 2008 Oralando, FL, pp. 287-290.*

Kaji et al. Ultrahigh-Voltage SiC p-i-n Diodes With Improved Forward Characteristics, IEEE Transactions on Electron Devices, vol. 62, No. 2, Feb. 2015, pp. 374-381.*

* cited by examiner

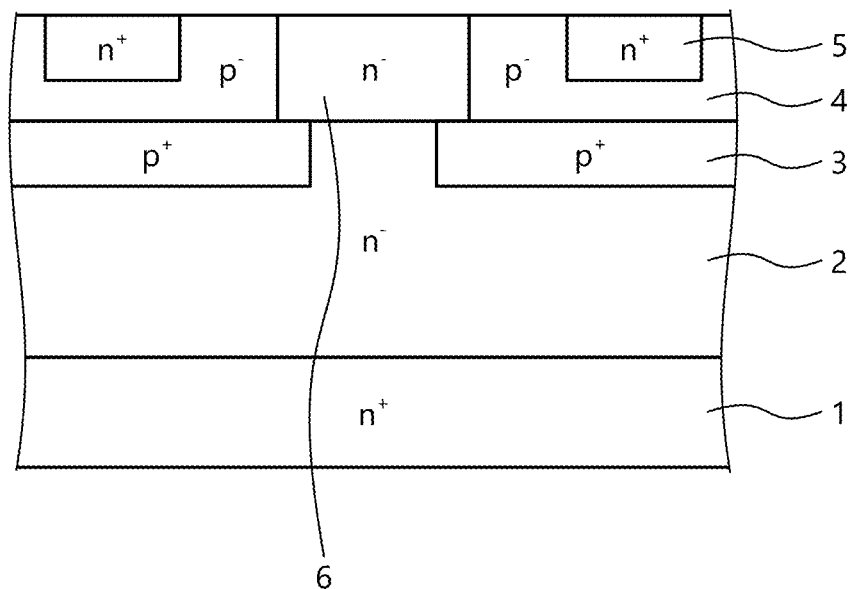
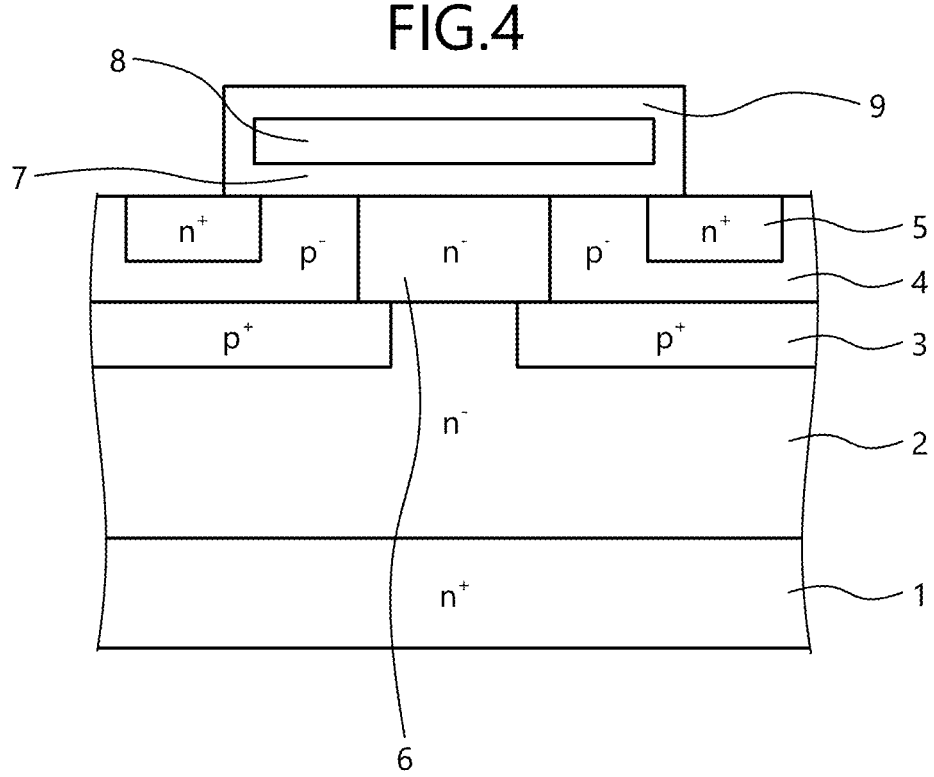

METHOD OF MANUFACTURING A SILICON CARBIDE SEMICONDUCTOR DEVICE INCLUDING DEPOSITING A SECOND SILICON CARBIDE SEMICONDUCTOR ON AN ETCHED SILICON CARBIDE BASE REGION

CROSS REFERENCE TO RELATED APPLICATIONS

This application is based upon and claims the benefit of priority of the prior Japanese Patent Application No. 2016-053121, filed on Mar. 16, 2016, the entire contents of which are incorporated herein by reference.

BACKGROUND OF THE INVENTION

1. Field of the Invention

Embodiments of the present invention relate to a silicon carbide semiconductor device and a method of manufacturing a silicon carbide semiconductor device.

2. Description of the Related Art

As is widely known, semiconductor elements using silicon carbide (SiC) as a material are expected to replace those of silicon (Si) in next generation semiconductor devices. The reason for this is that compared to conventional semiconductor elements using Si as a material, SiC has various advantages such as use in environments of high temperatures (200 degrees C. or more) and being able to reduce the on-resistance of an element to 1 few-hundredths of that of a conventional semiconductor element. Such advantages are enabled by characteristics of the material itself such as the bandgap of SiC being about 3 times that of Si and the dielectric breakdown field strength being nearly 10 times that of Si.

Schottky diodes and planar vertical metal oxide semiconductor field effect transistors (MOSFET) have become commercial SiC semiconductor devices.

Nonetheless, for the most part, SiC MOSFETs have low channel mobility and therefore, have high channel resistance and cannot obtain the expected low on-resistance. One contributing factor is that since SiC has a small impurity diffusion coefficient, a channel region is inevitably created by ion implantation and, crystal defects induced by ion implantation and interstitial impurities that are not activated lower channel mobility.

On the other hand, SiC MOSFETs having a channel region created by epitaxial growth (hereinafter, abbreviated as "epi-growth") are known (for example, refer to International Publication No. 2004/036655). In such devices, a low-concentration $p^-$-type epitaxial layer is grown as a channel region whereby high channel mobility is realized by high crystallinity and a suppression of impurity diffusion. Further, breakdown voltage between the drain and the source consequent to making the $p^-$-type epitaxial layer of a low concentration is maintained by providing a high-concentration p-type ion implanted layer under the $p^-$-type epitaxial layer.

SUMMARY OF THE INVENTION

A silicon carbide semiconductor device according to one aspect of the present invention includes a silicon carbide semiconductor substrate of a first conductivity type; a first silicon carbide semiconductor deposition layer of the first conductivity type, deposited on a front surface of the silicon carbide semiconductor substrate, the silicon carbide semiconductor deposition layer having an impurity concentration that is lower than that of the silicon carbide semiconductor substrate; a second-conductivity-type region selectively provided in a surface layer on an opposite side of the first silicon carbide semiconductor deposition layer with respect to the silicon carbide semiconductor substrate; and a second silicon carbide semiconductor deposition layer of a second conductivity type, deposited on a surface of the opposite side of the first silicon carbide semiconductor deposition layer. The second-conductivity-type region has an impurity concentration of $1\times10^{18}$ to $1\times10^{20}/cm^3$ and a thickness of 0.3 to 1.0 μm. The second silicon carbide semiconductor deposition layer has a surface defect density of 3 defects/$cm^2$.

A method of manufacturing a silicon carbide semiconductor device according to another aspect of the present invention includes forming a first silicon carbide semiconductor deposition layer of a first conductivity type on a front surface of a silicon carbide semiconductor substrate of the first conductivity type, the first silicon carbide semiconductor deposition layer having an impurity concentration that is lower than that of the silicon carbide semiconductor substrate; selectively forming a second-conductivity-type region in a surface layer on an opposite side of the first silicon carbide semiconductor deposition layer with respect to the silicon carbide semiconductor substrate; and forming a second silicon carbide semiconductor deposition layer of a second conductivity type on the opposite side of the first silicon carbide semiconductor deposition layer. The second-conductivity-type region is formed to have an impurity concentration that is $1\times10^{18}$ to $1\times10^{20}/cm^3$, and a thickness that is 0.3 to 1.0 μm. An amount of etching of the second silicon carbide semiconductor deposition layer when the second silicon carbide semiconductor deposition layer is formed is 0.01 to 0.05 μm.

In the method of manufacturing a silicon carbide semiconductor device, when the second silicon carbide semiconductor deposition layer is formed by epitaxial growth, an atmosphere during temperature raising is a mixed atmosphere of a first gas that is a noble gas and a second gas that thermally decomposes and generates a silicon vapor.

In the method of manufacturing a silicon carbide semiconductor device, the first gas is one of argon and helium, and the second gas is one of monosilane, disilane, dichlorosilane, trichlorosilane, and silicon tetrachloride.

Objects, features, and advantages of the present invention are specifically set forth in or will become apparent from the following detailed description of the invention when read in conjunction with the accompanying drawings.

BRIEF DESCRIPTION OF THE DRAWINGS

FIGS. 2, 3, and 4 are cross-sectional views depicting states of the MOSFET according to the embodiment during manufacture;

DETAILED DESCRIPTION OF THE INVENTION

Figure 1:
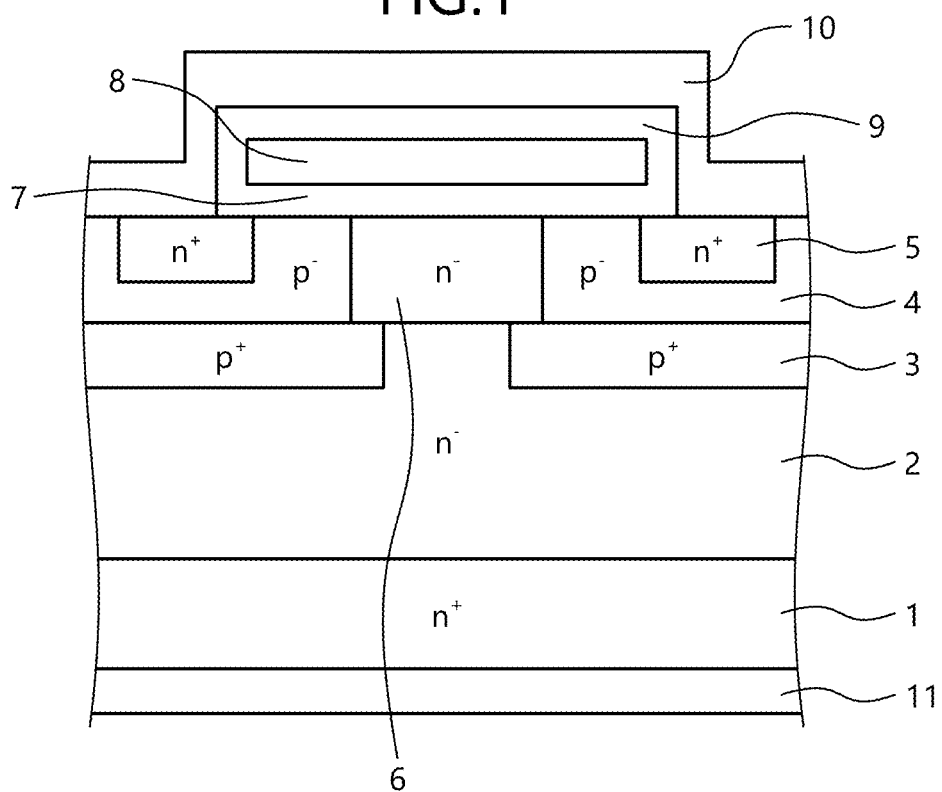
FIG. 1 is a cross-sectional view depicting a MOSFET according to an embodiment.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, identical constituent elements will be given the same reference numerals and will not be repeatedly described. Further, in the present description, when Miller indices are described, "−" means a bar added to an index immediately after the "−", and a negative index is expressed by prefixing "−" to the index.

In an embodiment, a silicon carbide semiconductor device produced (manufactured) using silicon carbide will be described taking a MOSFET as an example. FIG. 1 is a cross-sectional view depicting the MOSFET according to the embodiment.

As depicted in FIG. 1, in the silicon carbide semiconductor device according to the embodiment, an n⁻-type epitaxial layer (first silicon carbide semiconductor deposition layer of a first conductivity type) 2 is deposited on a first principal surface (front surface) of an n⁺-type silicon carbide substrate (a silicon carbide semiconductor substrate of the first conductivity type) 1.

The n⁺-type silicon carbide substrate 1, for example, is a silicon carbide, single-crystal substrate doped with nitrogen (N). The n⁻-type epitaxial layer 2 has an impurity concentration that is lower than that of the n⁺-type type silicon carbide substrate 1 and, for example, is a low-concentration, n-type drift layer doped with nitrogen. Hereinafter, the n⁺-type silicon carbide substrate 1 and the n⁻-type epitaxial layer 2 will be collectively regarded as a silicon carbide semiconductor base.

On a front surface side of the silicon carbide semiconductor base, a metal oxide semiconductor (MOS) gate structure (element structure) is formed. In particular, in a surface layer on an opposite side (the front surface side of the silicon carbide semiconductor base) of the n⁻-type epitaxial layer 2 with respect to the n⁺-type silicon carbide substrate 1, p⁺-type base regions (second-conductivity-type region) 3 are selectively provided.

On a surface on the opposite side (the front surface side of the silicon carbide semiconductor base) of the n⁻-type type epitaxial layer 2 with respect to the n⁺-type silicon carbide substrate 1, a p⁻-type epitaxial layer (second silicon carbide semiconductor deposition layer of a second conductivity type) 4 functioning as a channel is deposited.

Here, an impurity concentration of the p⁺-type base regions 3 may be $1\times10^{18}$ to $1\times10^{20}/cm^3$ and a thickness of the p⁺-type base regions 3 may be 0.3 to 1.0 μm after device formation. This is to improve poor breakdown voltage between the drain and the source and poor breakdown voltage of the gate insulating film.

A certain improvement effect is seen with poor breakdown voltage between the drain and the source when the thickness of the p⁺-type base regions 3 is 1.0 μm or greater and the impurity concentration is $1\times10^{20}/cm^3$ higher. However, since the p⁺-type base regions 3 are thick, the time required for the ion implantation process leads to increased process cost. Further, consequent to deeply implanting an ion species in a large amount by high acceleration energy, crystal defects in the p⁻-type epitaxial layer 4 formed thereon increase to 5 defects/cm² or more and surface roughness, i.e., a root mean square (RMS) roughness, increases to 5 nm or more (10 μm×10 μm evaluation area). As a result, poor breakdown voltage of the gate insulating film and decreased channel mobility are caused.

On the contrary, when the thickness of the p⁺-type base regions 3 is thinned to 0.3 μm or less and the impurity concentration is lowered to $1\times10^{18}/cm^3$ or less, this leads to poor breakdown voltage between the drain and the source consequent to punch-through of the p⁺-type base regions 3. Therefore, the thickness of the p⁺-type base regions 3 may be 0.3 to 1.0 μm and the impurity concentration thereof may be $1\times10^{18}$ to $1\times10^{20}/cm^3$.

Further, when surface defects of the p⁻-type epitaxial layer 4 are numerous, breakdown voltage of a gate insulating film 7 described hereinafter decreases and therefore, surface defect density of the p⁻-type epitaxial layer 4 may be 3 defects/cm² or less.

In the p⁻-type epitaxial layer 4, n⁺-type source regions 5 are selectively provided away from the n⁻-type epitaxial layer 2. Further, in the p⁻-type epitaxial layer 4, p⁺-type contact regions (not depicted) having a higher impurity concentration than that of the p⁻-type epitaxial layer 4 are selectively provided. Also, in the p⁻-type epitaxial layer 4, a low-concentration n⁻-type base region 6 is provided contacting the n⁻-type epitaxial layer 2.

On a surface of a portion of the p⁻-type epitaxial layer 4 between the n⁺-type source regions 5 and on a surface of the low-concentration n⁻-type base region 6, a gate electrode 8 is provided via the gate insulating film 7. The gate electrode 8 may be provided extending to surfaces of the n⁺-type source regions 5 via the gate insulating film 7.

On the front surface side of the silicon carbide semiconductor base, an interlayer insulating film 9 is provided so as to cover the gate electrode 8. A source electrode 10 electrically connected to the n⁺-type source regions 5 and the p⁺-type contact regions is provided contacting the n⁺-type source regions 5 and the p⁺-type contact regions via a contact hole opened in the interlayer insulating film 9.

On a second principal surface (rear surface, i.e., a rear surface of the silicon carbide semiconductor base) of the n⁺-type silicon carbide substrate 1, a rear electrode 11 is provided. The rear electrode 11 constitutes a drain electrode.

Figure 2:
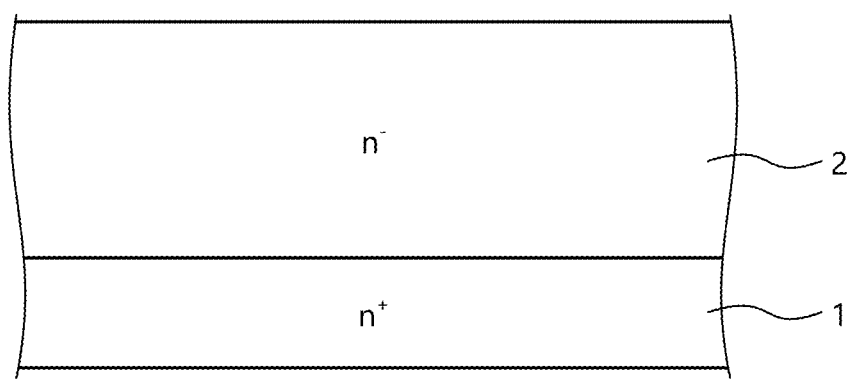

A method of manufacturing a MOSFET according to the embodiment will be described. FIGS. 2, 3, and 4 are cross-sectional views depicting states of the MOSFET according to the embodiment during manufacture.

First, the n⁺-type silicon carbide substrate 1 doped with nitrogen is prepared. Next, on the first principal surface of the n⁺-type silicon carbide substrate 1, the n⁻-type epitaxial layer 2 doped with nitrogen is formed by epitaxial growth. The state up to here is depicted in FIG. 2.

On the surface of the n⁻-type epitaxial layer 2, a mask having a desired opening formed by a photolithography technique, for example, is formed by a resist or an oxide film. A p-type impurity, e.g., aluminum (Al), is ion implanted by an ion implantation method using the resist or an oxide film as a mask. As a result, the p⁺-type base regions 3 are formed in portions of a surface region of the n⁻-type epitaxial layer 2. The mask used during the ion implantation for forming the p⁺-type base regions 3 is removed.

Next, on the surface of the n⁻-type epitaxial layer 2, the p⁻-type epitaxial layer 4 is formed by epitaxial growth at a temperature of 1550 degrees C. or higher. In this epitaxial growth, although a surface of the p⁺-type base regions 3 is etched, the amount of etching of the surface may range from 0.01 to 0.05 μm. This is to improve poor breakdown voltage between the drain and the source, and to improve breakdown voltage yield of the gate insulating film 7.

Figure 5:
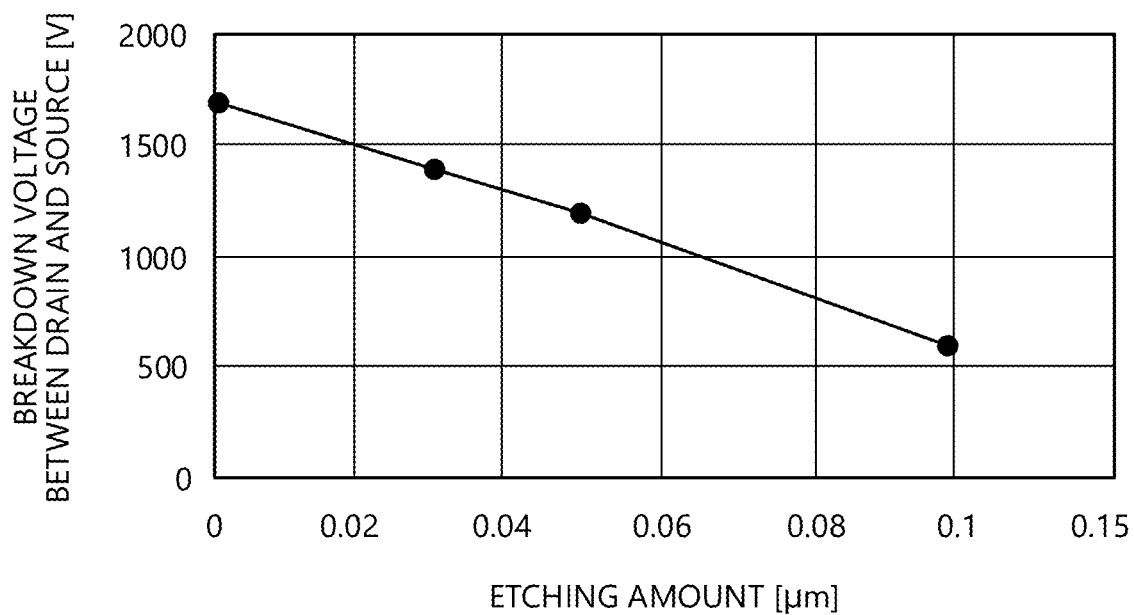
FIG. 5 is a graph depicting a relationship of the amount of surface etching of $p^+$-type base regions 3 and breakdown voltage between a drain and a source.

FIG. 5 is a graph depicting the relationship of the amount of surface etching of the p⁺-type base regions 3 and breakdown voltage between the drain and the source. In a silicon carbide semiconductor device, the breakdown voltage between the drain and the source has to be 1200V or higher. From FIG. 5, it is found that to maintain a breakdown voltage of 1200V or higher between the drain and the source, the amount of surface etching of the p⁺-type base regions 3 is to be 0.05 μm or less.

Figure 6:
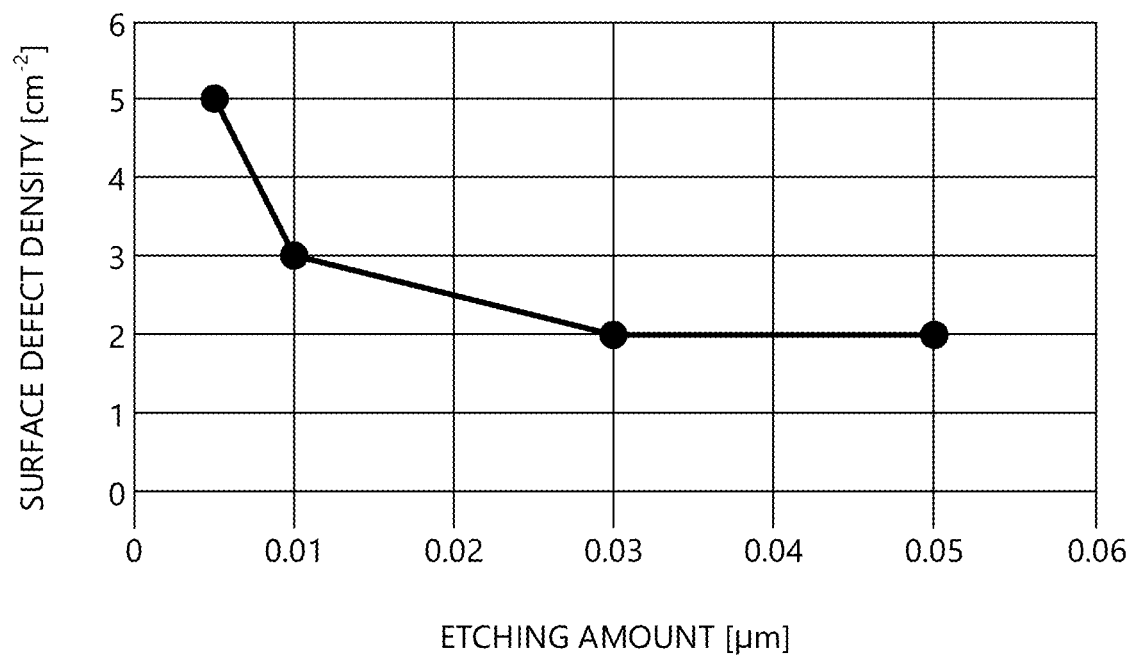
FIG. 6 is a graph depicting a relationship of the amount of surface etching of the $p^+$-type base regions 3 and surface defect density of a $p^-$-type epitaxial layer 4.

FIG. 6 is a graph depicting the relationship of the amount of surface etching of the p⁺-type base regions 3 and surface defect density of the p⁻-type epitaxial layer 4. To improve the breakdown voltage yield of the gate insulating film, the surface defect density of the p⁻-type epitaxial layer 4 has to be 3 defects/cm² or less. From FIG. 6, it is found that to improve the breakdown voltage yield of the gate insulating film 7, the amount of surface etching of the p⁺-type base regions 3 is to be 0.01 μm or more.

Therefore, the amount of surface etching of the p⁺-type base regions 3 when the p⁻-type epitaxial layer 4 is formed by epitaxial growth is set to range from 0.01 to 0.05 μm whereby poor breakdown voltage between the drain and the source, and breakdown voltage yield of the gate insulating film 7 may be improved.

Figure 7:
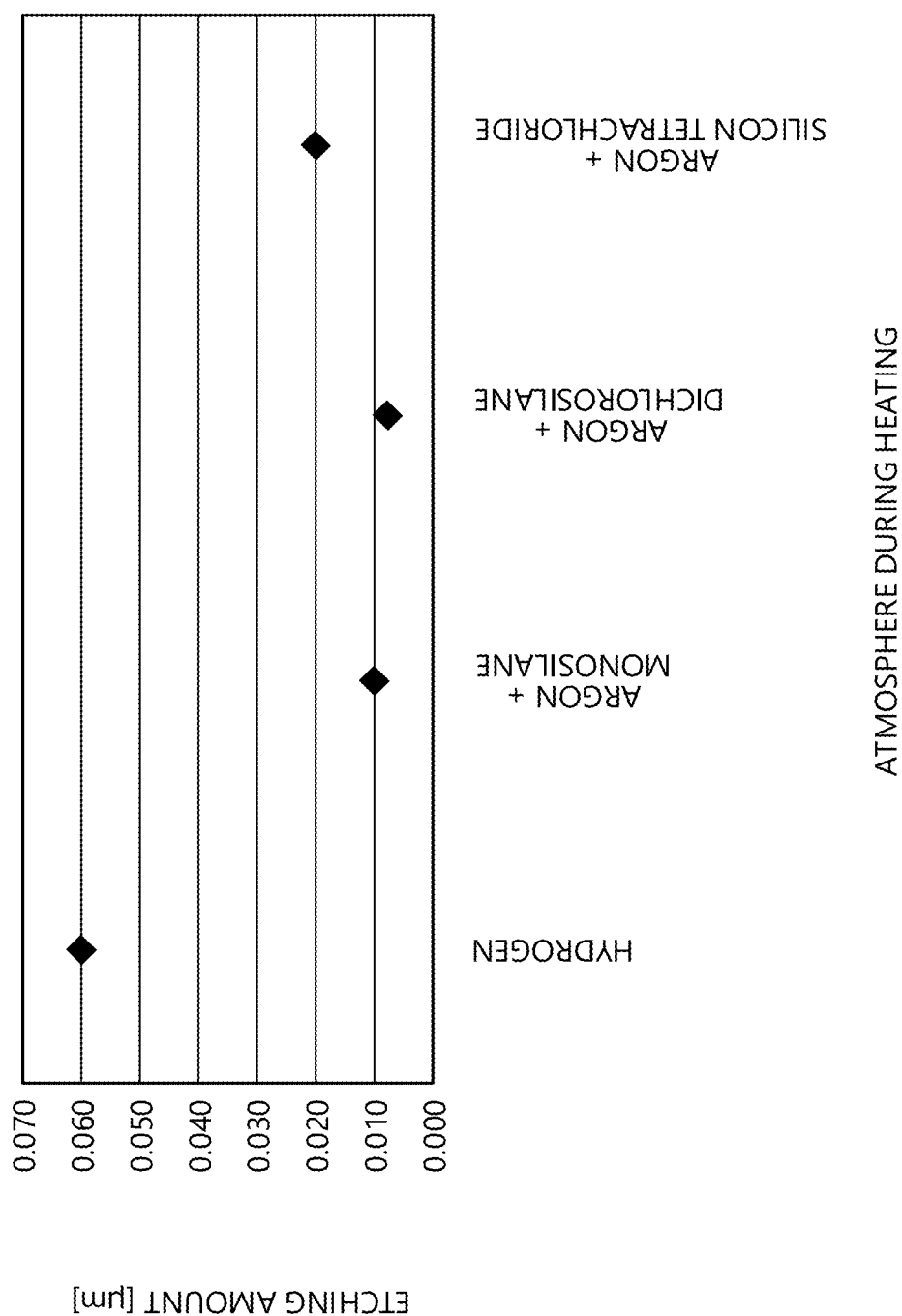
FIG. 7 is a graph depicting a relationship of an atmosphere during temperature raising and the amount of surface etching of the p+-type base regions 3.

Here, a method for making the amount of surface etching of the p+-type base regions 3 range from 0.01 to 0.05 μm is described. An etching reaction of silicon carbide with hydrogen occurs with evaporation of Si by a high temperature and the generation of hydrocarbon gas from a reaction of carbon (C) and hydrogen; therefore, the atmosphere during temperature raising and the amount of surface etching of the p+-type base regions 3 are related. FIG. 7 is a graph depicting the relationship of the atmosphere during temperature raising and the amount of surface etching of the p+-type base regions 3. From FIG. 7, it is found that in the case of a hydrogen atmosphere during temperature raising, the amount of surface etching of the p+-type base regions 3 is large compared to a case in which monosilane, dichlorosilane (SiH2Cl2), or silicon tetrachloride (SiCl4) is added to an argon (Ar) atmosphere during temperature raising.

In other words, it was found that when the p--type epitaxial layer 4 is formed by epitaxial growth, the amount of surface etching of the p+-type base regions 3 is reduced by temperature raising in a mixed atmosphere of a noble gas (i.e., an inert gas) and a gas that generates a Si vapor by thermal decomposition.

Figure 8:
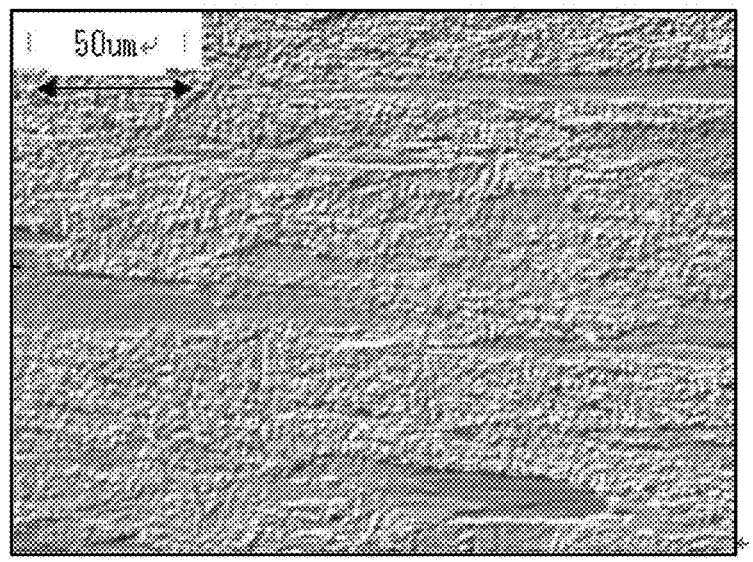
FIG. 8 is a photograph of a surface of a silicon carbide substrate in a case of temperature raising in an argon atmosphere.
Figure 9:
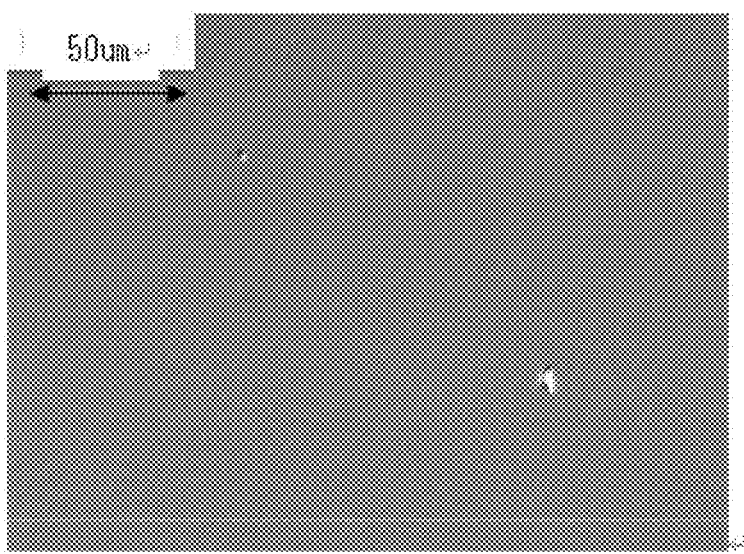
FIG. 9 is a photograph of a surface of a silicon carbide substrate in a case of temperature raising in an argon+ monosilane atmosphere.

On the other hand, when epitaxial growth is performed and temperature raising is performed in an atmosphere of only an inert gas, the substrate surface becomes rough as shown below. Results of investigation of the surface state of SiC substrates for which only temperature raising/lowering was performed are shown below. FIG. 8 is a photograph of the surface of a silicon carbide substrate in a case of temperature raising in an argon atmosphere. FIG. 9 is a photograph of the surface of a silicon carbide substrate in a case of temperature raising in an argon+monosilane atmosphere. In FIGS. 8 and 9, 50 um means 50 μm. From FIGS. 8 and 9, it was found that when the atmosphere during temperature raising is argon, the surface of the silicon carbide substrate becomes rough compared to a case where the atmosphere during temperature raising is argon+monosilane. The reason for this is that when the atmosphere during temperature raising includes only an inert gas, Si from the SiC substrate evaporates and, the surface becomes carbonized and rough. Thus, a gas that generates a Si vapor is slightly added and Si vapor pressure is supplied from outside the furnace whereby evaporation of Si from the SiC substrate may be prevented.

Therefore, to set the amount of surface etching of the p+-type base regions 3 to range from 0.01 to 0.05 μm and prevent the surface of the silicon carbide substrate from becoming rough, temperature raising is performed in a mixed atmosphere of an inert gas and a gas that generates a Si vapor by thermal decomposition.

Here, an inert gas is, for example, argon, or helium (He); and a gas that generates a Si vapor by thermal decomposition is, for example, monosilane, disilane ($Si_2H_6$), dichlorosilane, trichlorosilane ($SiHCl_3$), or silicon tetrachloride. However, concerning a gas that generates a Si vapor by thermal decomposition, the ease of thermal decomposition differs according to the gaseous species and therefore, the amount of gas introduced into the furnace has to be adjusted for each gaseous species.

In the actual epi-growth sequence, temperature raising is performed in a mixed atmosphere of an inert gas and a gas that generates a Si vapor and after the growth temperature is reached, the atmosphere is switched to hydrogen. At this time, by adjusting the time required for the switching, the growth surface is etched by a necessary and sufficient amount (0.01 to 0.05 μm). Thereafter, a growth gas such as monosilane, propane, etc. is added and the epi-growth begins. The sequence of the SiC epi-growth hereafter is the same as a conventional sequence.

Here, description returns to the method of manufacturing a MOSFET according to the embodiment and FIG. 3. On the surface of the p⁻-type epitaxial layer 4, a mask having desired openings formed by a photolithography technique is, for example, formed by a resist or an oxide film. An n-type impurity is ion implanted by an ion implantation method that uses this resist or an oxide film as a mask. As a result, the n⁺-type source regions 5 are formed at portions of the surface region of the p⁻-type epitaxial layer 4. The mask used during the ion implantation for forming the n⁺-type source regions 5 is removed.

On the surface of the p⁻-type epitaxial layer 4, a mask having desired openings formed by a photolithography technique is, for example, formed by a resist or an oxide film. A p-type impurity is ion implanted by an ion implantation method that uses this resist or an oxide film as a mask. As a result, the p⁺-type contact regions (not depicted) are formed at portions of the surface region of the p⁻-type epitaxial layer 4. The mask used during the ion implantation for forming the p⁺-type contact regions is removed.

Next, on the surface of the p⁻-type epitaxial layer 4, a mask having a desired opening formed by a photolithography technique is, for example, formed by a resist or an oxide film. An n-type impurity is ion implanted by an ion implantation method that uses this resist or an oxide film as a mask. As a result, the low-concentration n⁻-type base region 6 is formed at a portion of the surface region of the p⁻-type epitaxial layer 4. The mask used during the ion implantation for forming the low-concentration n⁻-type base region 6 is removed.

Next, heat treatment (annealing) for activating the n⁺-type source regions 5, the p⁺-type contact regions, and the low-concentration n⁻-type base region 6 is performed. Here, the sequence in which the n⁺-type source regions 5, the p⁺-type contact regions, and the low-concentration n⁻-type base region 6 are formed may be variously changed. The state up to here is depicted in FIG. 3.

The front surface side of the silicon carbide semiconductor base is thermally oxidized and the gate insulating film 7 is formed. As a result, the n⁻-type epitaxial layer 2 and each region formed on the surfaces of the n⁻-type epitaxial layer 2 is covered by the gate insulating film 7.

On the gate insulating film 7, a poly-silicon layer is formed as the gate electrode 8. The poly-silicon layer is patterned and selectively removed so that the poly-silicon layer remains on a portion of the p⁻-type epitaxial layer 4 between the n⁺-type source regions 5 and on the low-concentration n⁻-type base region 6. At this time, the poly-silicon layer may be left on the n⁺-type source regions 5.

Next, the interlayer insulating film 9 is formed so as to cover the gate electrode 8. The interlayer insulating film 9 is patterned and selectively removed whereby a contact hole is formed, exposing the n⁺-type source regions 5 and the p⁺-type contact regions. The state up to here is depicted in FIG. 4.

A conductive film that becomes the source electrode 10 is formed in the contact hole and on the interlayer insulating film 9. The conductive film is selectively removed so that, for example, the source electrode 10 remains only in the contact hole.

On the second principal surface of the n⁺-type silicon carbide substrate 1, for example, a drain electrode 11 made from a nickel (Ni) film is formed. Thereafter, for example, heat treatment is performed at 970 degrees C. whereby the n⁺-type silicon carbide substrate 1 and the drain electrode 11 form an ohmic contact. Thus, the MOSFET depicted in FIG. 1 is completed.

A MOSFET manufacturing process will be described as a first example of the present invention. First, on the n⁺-type silicon carbide substrate 1 of a 4-degree off-axis 4H—SiC (4-layer periodic hexagonal silicon carbide) (000-1) face, the n⁻-type epitaxial layer 2 having an impurity concentration of $1 \times 10^{16}/cm^3$ and a thickness of 10 μm was formed. On the n⁻-type epitaxial layer 2, a mask of an oxide film was formed; Al was selectively ion implanted to obtain a concentration profile in which the concentration was $3 \times 10^{18}/cm^3$ at a depth of 0.4 μm; the p⁺-type base regions 3 were formed; and the oxide film was removed. The concentration profile of the p⁺-type base regions 3 after the Al implantation has an impurity concentration desirably of $1 \times 10^{18}$ to $1 \times 10^{20}/cm^3$ at a depth of 0.3 to 1.0 μm.

Figure 10:
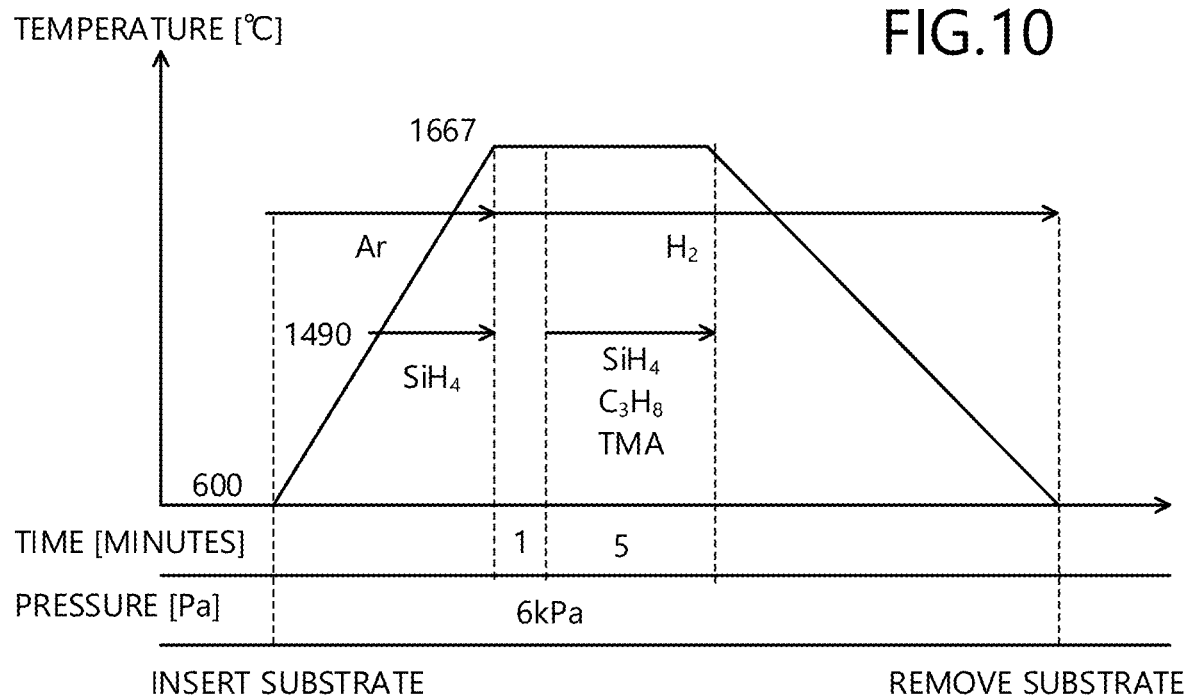
FIG. 10 is a graph depicting a growth sequence of the p⁻-type epitaxial layer in a first example.

On the p⁺-type base regions 3, the p⁻-type epitaxial layer 4 having a thickness of 0.5 μm was grown as a channel region. FIG. 10 is a graph depicting a growth sequence of the p⁻-type epitaxial layer in the first example. The growth sequence of the p⁻-type epitaxial layer 4 will be described with reference to FIG. 10.

First, the temperature inside an epitaxial growth furnace was raised to 600 degrees C. and after the substrate was placed inside, argon gas was flowed in at 1 slm (standard liter per minute) as an atmosphere gas and the pressure was set to 11 kPa. Next, at a stage when the temperature reached 1490 degrees C., a monosilane gas was added at 0.1 sccm (standard cubic centimeter per minute), and the temperature was further raised to a film-forming temperature of 1667 degrees C. Thereafter, the flow of argon and monosilane gas was suspended, hydrogen was flowed in at 100 slm for 1 minute, and the inside of the furnace was switched to a hydrogen atmosphere. As conditions during temperature raising, an argon to monosilane gas ratio of $1:1\times10^{-5}$ to $1\times10^{-4}$, a film-forming temperature of 1550 degrees C. to 1750 degrees C., and a pressure of 5 to 11 kPa are desirable.

Thereafter, a dilute monosilane gas of 10% in hydrogen was flowed in at 500 sccm as a source gas, similarly a dilute propane gas of 10% was flowed in at 200 sccm, a dilute trimethylaluminium (TMA) gas of 100 ppm was flowed in at 100 sccm, and the p⁻-type epitaxial layer 4 was grown for 5 minutes.

Next, the source gas was suspended, the temperature was reduced to 600 degrees C. in a hydrogen atmosphere and the substrate was removed from the epitaxial growth furnace. Thereafter, the n⁺-type source regions 5, the p⁺-type contact regions (not depicted), and the low-concentration n⁻-type base region 6 were formed by formation of an oxide film mask and ion implantation. Activation heat treatment was performed and the implanted ions were activated. Thereafter, the gate insulating film 7 was formed by wet oxidation. Next, the gate electrode 8, the interlayer insulating film 9, the source electrode 10, and the drain electrode 11 were formed, producing a MOSFET 1.

Examination of the MOSFET 1 revealed that the surface defect density of the p⁻type epitaxial layer 4 below the gate insulating film 7 was 3 defects/cm² or less. Further, the final thickness of the p⁺-type base regions 3 was 0.39 μm (etching amount: 0.01 μm). The rate of poor breakdown voltage of the gate insulating film 7 and the rate of poor breakdown voltage between the drain and the source in the MOSFET created using the growth sequence of the present invention was 18% combined compared to 50% or more for a MOSFET created using a conventional p⁻-type epitaxial layer growth sequence and thus, compared to a conventional case, a high element yield ratio was obtained.

A MOSFET manufacturing process will be described as a second example of the present invention. First, on the n⁺-type silicon carbide substrate 1 of a 4-degree off-axis 4H—SiC (000-1) face, the n⁻-type epitaxial layer 2 having an impurity concentration of $1 \times 10^{16}/cm^3$ and a thickness of 10 μm was formed. On the n⁻-type epitaxial layer 2, a mask of an oxide film was formed; Al was selectively ion implanted to obtain a concentration profile in which the concentration was $4 \times 10^{18}/cm^3$ at a depth of 0.4 μm; the p⁺-type base regions 3 were formed, and the oxide film was removed. The concentration profile after the Al implantation has an impurity concentration desirably $1 \times 10^{18}$ to $1 \times 10^{20}/cm^3$ at a depth of 0.3 to 1.0 μm.

Figure 11:
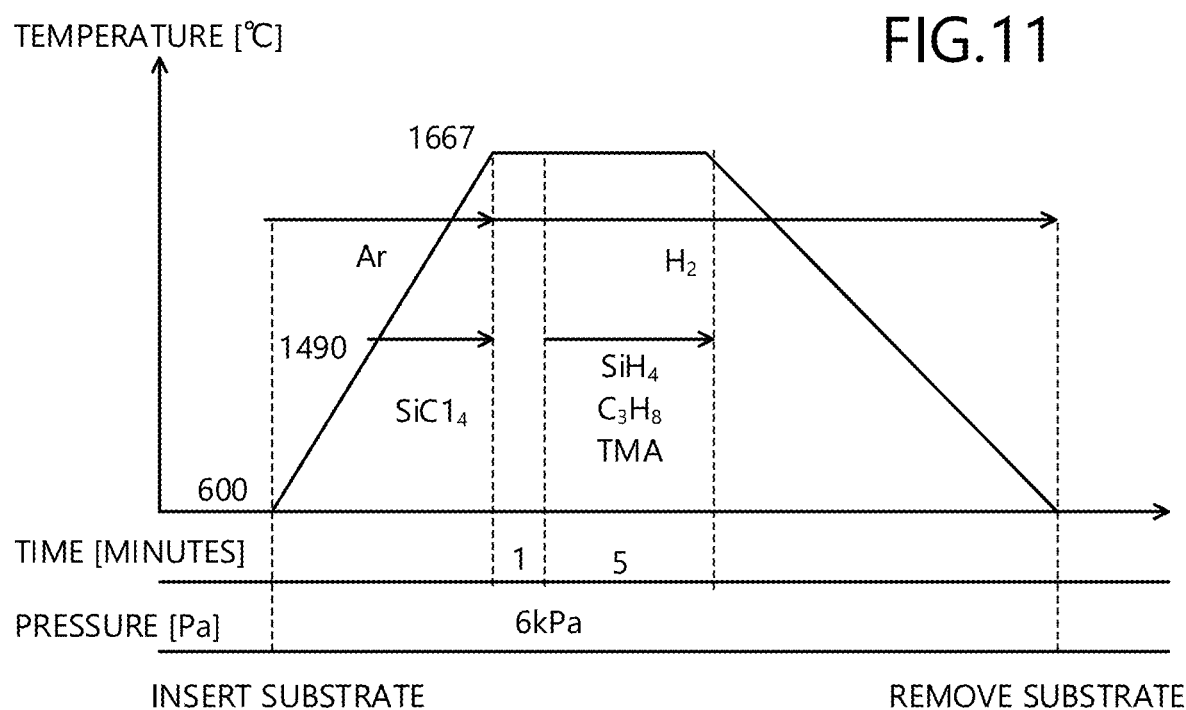
FIG. 11 is a graph depicting a growth sequence of the p⁻-type epitaxial layer in a second example.

On the p⁺-type base regions 3, the p⁻-type epitaxial layer 4 having a thickness of 1.0 μm was grown as a channel region. FIG. 11 is a graph depicting a growth sequence of the p⁻-type epitaxial layer in the second example. The growth sequence of the p⁻-type epitaxial layer 4 will be described with reference to FIG. 11.

First, the temperature inside an epitaxial growth furnace was raised to 600 degrees C. and after the substrate was placed inside, argon gas was flowed in at 1 slm as an atmosphere gas and the pressure was set to 11 kPa. Next, at a stage when the temperature reached 1490 degrees C., silicon tetrachloride gas was added at 1 sccm, and the temperature was further raised to a film-forming temperature of 1667 degrees C. Thereafter, the flow of argon and a silicon tetrachloride gas was suspended, hydrogen was flowed in at 100 slm for 1 minute, and the inside of the furnace was switched to a hydrogen atmosphere. As conditions during temperature raising, an argon to silicon tetrachloride gas ratio of 1:1×10-5 to 1×10-4, a film-forming temperature of 1550 degrees C. to 1750 degrees C., and a pressure of 5 to 11 kPa are desirable.

Thereafter, a dilute monosilane gas of 10% in hydrogen was flowed in at 500 sccm as a source gas, similarly a dilute propane gas of 10% was flowed in at 200 sccm, a dilute TMA gas of 100 ppm was flowed in at 100 sccm, and the p⁻-type epitaxial layer 4 was grown for 5 minutes.

Next, the source gas was suspended, the temperature was reduced to 600 degrees C. in a hydrogen atmosphere, and the substrate was removed from the epitaxial growth furnace. Thereafter, the n⁺-type source regions 5, the p⁺-type contact regions (not depicted), and the low-concentration n⁻-type base region 6 were formed by formation of an oxide mask and ion implantation. Activation heat treatment was performed and the implanted ions were activated. Thereafter, the gate insulating film 7 was formed by wet oxidation. Next, the gate electrode 8, the interlayer insulating film 9, the source electrode 10, and the drain electrode 11 were formed, producing a MOSFET.

Examination of this MOSFET revealed that the surface defect density of the p⁻-type epitaxial layer 4 below the gate insulating film 7 was 2.5 defects/cm$^2$ or less. Further, the final thickness of the p⁺-type base regions 3 was 0.38 μm (etching amount: 0.02 μm). The rate of poor breakdown voltage of the gate insulating film 7 and the rate of poor breakdown voltage between the drain and the source in the MOSFET created using the proposed growth sequence was 20% combined compared to 50% or more for a MOSFET created using a conventional p⁻-type epitaxial layer growth sequence and thus, compared to a conventional case, a high element yield ratio was obtained.

As described, the silicon carbide semiconductor device according to the embodiment sets the impurity concentration of the p⁺-type base region to be 1×10$^{18}$/cm$^3$ or higher and sets the thickness of the p⁺-type base region to be 0.3 μm or more whereby poor breakdown voltage between the drain and the source may be improved. Further, the surface defect density of the p⁻-type epitaxial layer is set to 3 defects/cm$^2$ or less, the impurity concentration of the p⁺-type type base region is set to 1×10$^{20}$/cm$^3$ or less, and the thickness of the p⁺-type base region is set to 1.0 μm or less whereby poor breakdown voltage of the gate insulating film may be improved.

Further, the amount of etching of the p⁺-type base region is set to 0.01 μm or more whereby a 1200V breakdown voltage between the drain and the source is maintained; and the amount of etching of the p⁺-type base region is set to 0.05 μm or less whereby the surface defect density of the p⁻-type type epitaxial layer is 3 defects/cm$^2$ or less.

Further, epitaxial growth is performed at a high temperature and by setting the temperature raising atmosphere during the epitaxial growth of the p⁻-type epitaxial layer to be a mixed atmosphere of an inert gas and a gas that thermally decomposes and generates silicon vapor whereby the amount of etching of the p+-type base region may be set to 0.01 to 0.05 μm. As a result, poor breakdown voltage of the gate insulating film and poor breakdown voltage between the drain and the source of the silicon carbide semiconductor device is improved, enabling a high element yield to be obtained.

In the description, although the present invention has been described taking a case of a configuration of a MOS gate structure on the first principal surface of a silicon carbide substrate made from silicon carbide, without limitation hereto, the plane direction, etc. of the primary surface of the substrate may be variously changed. In the embodiments, although the first conductivity type is regarded to be an n-type and the second conductivity type is regarded to be a p-type, the present invention is similarly implemented when the first conductivity type is a p-type and the second conductivity type is an n-type.

Conventionally, when a channel region is formed by epi-growth, SiC epi-growth is performed in a high-temperature hydrogen ($H_2$) atmosphere. In this case, a problem arises in that the high-concentration p-type ion implanted layer is etched and the device structure is destroyed whereby poor breakdown voltage between the drain and the source frequently occurs.

In particular, in the method of International Publication No. 2004/036655, in the growth sequence of the SiC p--type epitaxial layer, which is a channel region, a SiC substrate is heated in a hydrogen atmosphere and after a growth temperature of 1550 degrees C. or higher is reached, a source gas such as monosilane (SiH4), propane (C3H8), etc. is added, growth begins, and after a predetermined growth period, the source gas is suspended, and the temperature is reduced in a hydrogen atmosphere. In this case, during temperature raising at 1500 degrees C. or higher, the SiC surface is etched about 0.05 to 0.1 μm by the hydrogen. The p+-type base region, which is a high-concentration p-type ion implanted layer, is also etched and consequent to an insufficient thickness of the high-concentration p-type ion implanted layer, poor breakdown voltage between the drain and the source is caused.

Thus, as a countermeasure, attempts to reduce the epi-growth temperature to 1500 degrees C. or less were made; however, consequent to excessive reduction of the amount of etching of the surface, this conversely lead to increased surface defects resulting from transport foreign particles on the growth surface. Furthermore, a mixture of stacking defects of 3C—SiC (silicon carbide of a cubic crystal structure), etc. on the substrate were observed, and poor breakdown voltage of the gate insulating film occurred frequently.

However, according to the present invention, the impurity concentration of the p⁺-type base region (second-conductivity-type region) is set to be 1×10$^{18}$/cm$^3$ or higher and the thickness of the p⁺-type base region is set to be 0.3 μm or more, enabling poor breakdown voltage between the drain and the source to be improved. Further, the surface defect density of the p⁻-type epitaxial layer (silicon carbide semiconductor deposition layer of the second conductivity type) is set to be 3 defects/cm$^2$ or less, enabling poor breakdown voltage of the gate insulating film to be improved.

Further, by setting the amount of etching of the p⁺-type base region to be 0.01 μm or more, the surface defect density of the p⁻-type epitaxial layer may be made to be 3 defects/cm$^2$ or less, and by setting the amount of etching of the p⁺-type base region to be 0.05 μm or less, a 1200V breakdown voltage between the drain and the source may be maintained.

The silicon carbide semiconductor device and the method of manufacturing a silicon carbide semiconductor device according to the present invention achieve an effect in that a channel region may be formed by epi-growth and, poor breakdown voltage between the drain and the source and poor breakdown voltage of the gate insulating film may be improved.

As described, the silicon carbide semiconductor device and the method of manufacturing a silicon carbide semiconductor device according to the present invention are useful for high-voltage semiconductor devices used in power converting equipment and power supply devices such as those in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device, the method comprising:

providing a silicon carbide semiconductor substrate of a first conductivity type;

forming a first silicon carbide semiconductor deposition layer of the first conductivity type on a front surface of the silicon carbide semiconductor substrate, the first silicon carbide semiconductor deposition layer having an impurity concentration that is lower than that of the silicon carbide semiconductor substrate, and a front surface and a back surface thereof that are opposite to each other, the back surface being disposed in contact with the front surface of the silicon carbide semiconductor substrate;

selectively forming a base region of a second conductivity type in the first silicon carbide semiconductor deposition layer at the front surface thereof, the base region having an impurity concentration of $1\times10^{18}$ to $1\times10/$ cm$^3$, and a thickness of 0.3 to 1.0 μm;

etching the base region to decrease the thickness of the base region by an amount of 0.01 to 0.05 μm, by raising a temperature of the silicon carbide semiconductor substrate having the first silicon carbide semiconductor deposition layer and the base region to a predetermined temperature in a temperature raising atmosphere including a first gas that is a noble gas and a second gas that generates a silicon vapor through thermal decomposition, and after the temperature of the silicon carbide semiconductor substrate reaches the predetermined temperature, suspending a flow of the first gas and the second gas, starting a flow of a hydrogen gas, and keeping the predetermined temperature in an atmosphere consisting of the hydrogen gas for a period of time; and subsequently initiating epi-growth by adding growth gases including carbon and silicon, to form a second silicon carbide semiconductor deposition layer of the second conductivity type on the front surface of the first silicon carbide semiconductor deposition layer in which the base region has been selectively formed.

2. The method of manufacturing a silicon carbide semiconductor device according to claim 1, wherein the first gas includes at least one of argon and helium, and the second gas includes at least one of monosilane, disilane, dichlorosilane, trichlorosilane, and silicon tetrachloride.

* * * * *